(12) United States Patent (10) Patent No.: US 8,214,172 B2
Wang et al. (45) Date of Patent: Jul. 3, 2012

(54) SYSTEMS AND METHODS FOR LOCATING DEFECTIVE COMPONENTS OF A CIRCUIT

(75) Inventors: Seongmoon Wang, Princeton Jct., NJ (US); Xiangyu Tang, Montgomery, AL (US)

(73) Assignee: NEC Laboratories America, Inc., Princeton, NJ (US)

( * ) Notice: Subject to any disclaimer, the term of this patent is extended or adjusted under 35 U.S.C. 154(b) by 579 days.

(21) Appl. No.: 12/393,533

(22) Filed: Feb. 26, 2009

(65) Prior Publication Data

US 2010/0121585 A1 May 13, 2010

Related U.S. Application Data

(60) Provisional application No. 61/113,284, filed on Nov. 11, 2008.

(51) Int. Cl.
*G01R 31/00* (2006.01)

(52) U.S. Cl. ............ 702/120; 702/159; 702/58; 702/59; 702/81; 702/185; 702/183; 702/117; 702/118

(58) Field of Classification Search .................. 702/120, 702/159
See application file for complete search history.

(56) References Cited

U.S. PATENT DOCUMENTS

| | | | | |
|---|---|---|---|---|
| 5,748,543 A | * | 5/1998 | Lee et al. ....................... | 365/200 |
| 6,829,740 B2 | * | 12/2004 | Rajski et al. .................. | 714/729 |
| 2004/0243337 A1 | * | 12/2004 | Whetsel ......................... | 702/120 |
| 2005/0240848 A1 | * | 10/2005 | Cote et al. ..................... | 714/726 |

OTHER PUBLICATIONS

Abramovici, M., et al. Online BIST and BIST-Based Diagnosis of FPGA Logic Blocks. 2004 IEEE. IEEE Transactions on Very Large Scale Integration (VLSI) Systems. vol. 12, No. 12. Dec. 2004. pp. 1284-1294.
Bower, F.A., et al. Autonomic Microprocessor Execution Via Self-Repairing Arrays. 2005 IEEE. IEEE Transactions on Dependable and Secure Computing. vol. 2, No. 4. Oct. 2005. pp. 297-310.
Bower, F.A., et al. Tolerating Hard Faults in Microprocessor Array Structures. 2004 IEEE. Proceedings of the 2004 international Conference on Dependable Systems and Networks (DSN'04). Jun. 2004. (10 pgs.)
Karpovsky, M.G., et al. Design of Self-Diagnostic Boards by Multiple Signature Analysis. 1993 IEEE. IEEE Transactions on Computers. vol. 42, No. 9. Sep. 1993. pp. 1035-1044.
Mazumder, P., et al. Restructuring of Square Processor Arrays by Built-In Self-Repair Circuit. 1993 IEEE. IEEE Transactions on Computer-Aided Design of Integrated Circuits and Systems. vol. 12, No. 9. Sep. 1993. pp. 1255-1265.
Rajski, J., et al. Brief Contributions: Diagnosis of Scan Cells in Bist Environment. IEEE Xplore. IEEE Transactions on Computers. vol. 48, No. 7. Jul. 1999. pp. 724-731.

* cited by examiner

*Primary Examiner* — Drew A Dunn
*Assistant Examiner* — Hyun Park
(74) *Attorney, Agent, or Firm* — James Bitetto; Joseph Kolodka

(57) ABSTRACT

According to exemplary methods and systems of the present principles, the location of defective field repairable units (FRUS) of a circuit that have varying sizes or varying numbers of scan cells may be identified by employing tiles including scan cells from different FRUS. A set of test patterns may be scanned through the scan cells such that cells belonging to FRUs within a tile may be concealed while analyzing the response of scan cells in the tile contributed by a different FRU. Further, defective tiles are discoverable at any tile location and in any quantity within a maximal capacity using a compressed signature. In addition, signature registers that process data at a rate that is faster than the scan shift rate of the circuit may be employed during compression to multiply a circuit response by a plurality of components of a compression matrix during one scan shift cycle.

5 Claims, 6 Drawing Sheets

SYSTEMS AND METHODS FOR LOCATING DEFECTIVE COMPONENTS OF A CIRCUIT

RELATED APPLICATION INFORMATION

This application claims priority to provisional application Ser. No. 61/113,284 filed on Nov. 11, 2008 incorporated herein by reference.

BACKGROUND

1. Technical Field

The present invention generally relates to diagnosing a circuit, and more particularly, to systems and methods for locating defective components within a circuit.

2. Description of the Related Art

Aggressive scaling of complementary metal-oxide-semiconductor (CMOS) technology has significantly improved performance and reduced the manufacturing cost of chips. However, despite these improvements, increased scaling may detrimentally affect chip reliability due to elevated chip temperature resulting from increased power density and leakage current. In addition, scaling has a significant impact on hard fault rates. Leakage current stemming from scaling reduces the reliability of traditional reliability circuit screening methods such as burn-in and IDD testing. Currently, large chips have more than a million gates. As such, screening all defective chips is extremely difficult and expensive for large chips. For example, even if a screening scheme achieves 99% stuck-at fault coverage for a million gate chip, 20,000 stuck-at faults remain uncovered. With regard to deep submicron technology, there are many defects that cannot be detected with existing fault models.

Furthermore, even if a test technique is able to screen and detect 100% of defective chips, working chips may become defective before their expected life spans as a result of power surge, human mistakes, and other factors. Since built-in self-repair (BISR) was first developed for standard DRAM devices to improve yield, BISR has been widely applied in a variety of other memory products. Currently, repair using BISR are done during manufacturing of circuits rather than in the field.

Existing techniques for locating defects in CMOS circuits employs compressed signatures that are indications of chip responses to test patterns. These techniques identify a set of candidate defect sites from the signatures by using extensive computations and, as a result, require an on-chip or off-chip processor. Although redundancy-based fault tolerance techniques have been used in systems that require high reliability, these techniques are less attractive solutions mainly due to the increase in power consumption resulting from their use.

Other techniques include self-diagnosis schemes that use special on-board hardware to locate defective chips on a board. Responses of each chip are sequentially collected by a space/time-compression circuit through a bus, one at a time. Thus, if the board includes many chips, a long diagnosis time is required. After responses from all chips are compressed into a signature, the signature is compared with a fault free signature and defective chips are identified using a decoder. The on-broad self-diagnosis circuit, which is usually based on a Reed-Solomon code, can locate a pre-determined number of defective chips.

However, existing techniques fail to identify defective blocks that have varying sizes within a chip. Furthermore, existing techniques fail to provide a means for processing a large number of responses in parallel with low hardware complexity.

SUMMARY

Methods and systems in accordance with various implementations of the present principles address the deficiencies of the prior art by enabling efficient diagnosis of circuits that include components of varying sizes. In exemplary implementations of the present principles, defective field repairable units that have different sizes may be identified by arranging scan cells of field repairable units within tiles, generating and scanning a set of test patterns through the scan cells, and selectively concealing test pattern responses from scan cells belonging to one or more field repairable units within a tile while analyzing the response of scan cells of a different field repairable unit. The concealment may be implemented, for example, by setting test pattern responses to a known value.

One advantage of applying exemplary features of the present principles is that they permit the application of a scan chain across different field repairable units. Moreover, responses of all FRUs may be observed simultaneously, thereby reducing diagnosis time. For example, defective tiles are discoverable at any tile location and in any quantity within a maximal capacity in one pass of a set of test patterns. In addition, efficiency may be further improved by exploiting the fact that registers process data at a rate that is faster than a scan shift rate of a circuit under diagnosis. Thus, certain exemplary space-compression circuit systems with reduced hardware overhead may be implemented by exploiting a frequency difference between a scan shift clock and a system clock.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

As noted above, most current testing using BISR is performed during manufacturing of circuits rather than in the field. If repairs are performed in the field as well as at manufacturing test sites, testing costs may be significantly reduced, as high reliability will be maintained even with less perfect screening. While the cost of testing transistors has been relatively constant, the cost of manufacturing a transistor has been significantly reduced as a result of persistent scaling. Hence, it would be economical to use some silicon area for field repair capability to reduce test cost. Implementing self-repair for random logics in regular application-specific integrated circuit (ASIC) devices, which have no regularity and are not field-reconfigurable, is much more difficult.

To repair defective parts by BISR, defective parts should be located through a self-diagnosis process. This includes comparing responses of the circuit under diagnosis (CUD) with responses of a defect free circuit, which may be stored on the chip. If all hardware for BISR should be implemented on the chip, minimizing hardware overhead is desirable. Hence, in accordance with aspects of the present principles, fault free responses may be compressed into small signatures.

Prior art systems employ Reed-Solomon code to locate defective chips on a board such that each chip is tested separately, one chip at a time, rather than testing all blocks at the same time. Hence, if there are many chips on the boards, prior art systems require a relatively long diagnosis time. Furthermore, in certain prior art systems, the number of scan chains in each chip is the same. However, sizes of blocks on a chip, such as an application specific integrated circuit (ASIC) are normally very diverse. Thus, applying this technique to self-diagnosing chips with blocks of varying sizes such that all blocks include the same number of scan chains is inefficient.

A significant advantage provided by exemplary system and method implementations of the present principles is that they efficiently account for CUDs that are composed of many blocks which have different sizes and are made up of different numbers of scan cells. Also, exemplary system and method implementations may be applied to process many responses that are output in parallel without storing them in memory. Thus, a large number of responses may be processed immediately in the same clock cycle. Further, in accordance with exemplary implementations of the present invention, defective parts of a CUD may be located through a self-diagnosis process using compressed signatures. Defective blocks may be identified despite the fact the blocks have varying sizes. Moreover, a large number of responses may be processed in parallel using low-complexity hardware.

Figure 1:
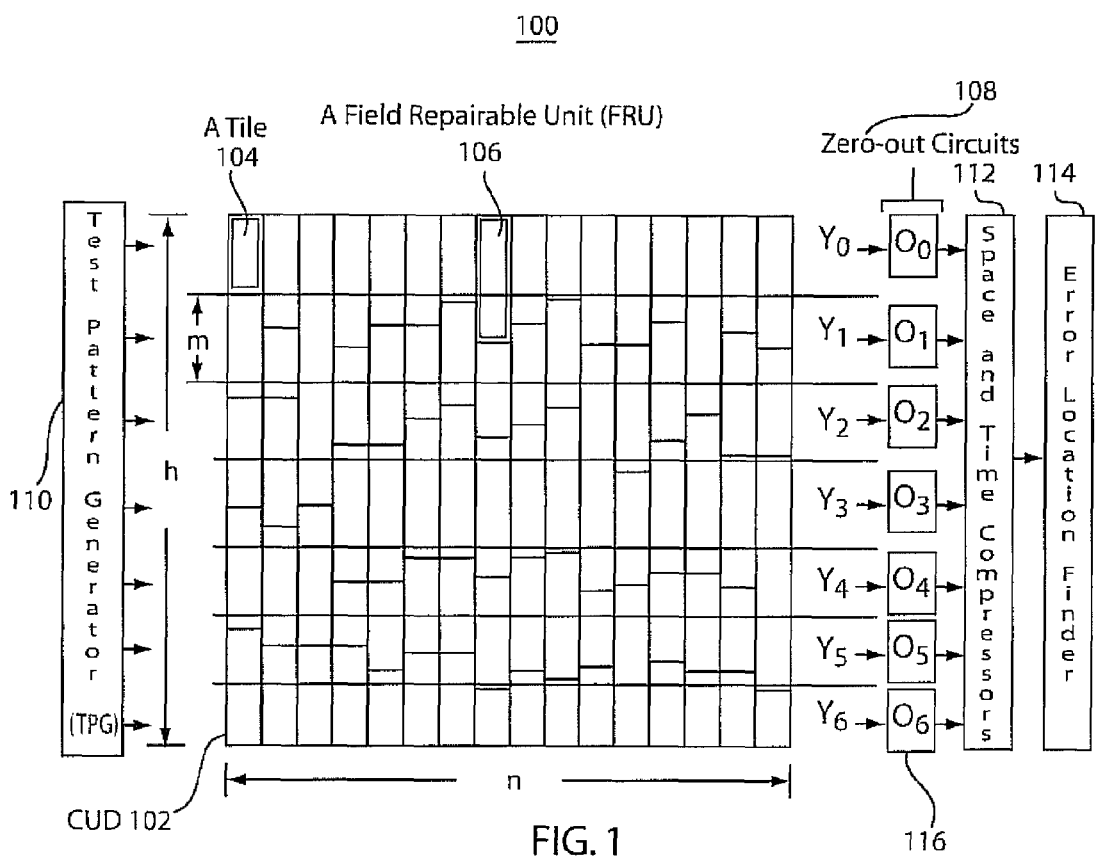
FIG. 1 is a high-level block/flow diagram of a system for locating defective field repairable units in accordance with exemplary implementations of the present principles.

Referring now in detail to the figures in which like numerals represent the same or similar elements and initially to FIG. 1, an exemplary system 100 implementation for detecting defects in a circuit according to the present invention is illustrated. Self-diagnosis schemes disclosed herein may locate defects on a chip for field-repair. System 100 may include a circuit under diagnosis (CUD) 102, which in turn, may include field repairable units (FRU) 106 and tiles 104. System 100 may further include a test pattern generator 110, zero-out circuits 108, space and time compressors 112 and an error location finder 114. The test pattern generator may be configured to generate test patterns of length h by using a pseudo-random number generator.

Figure 2:
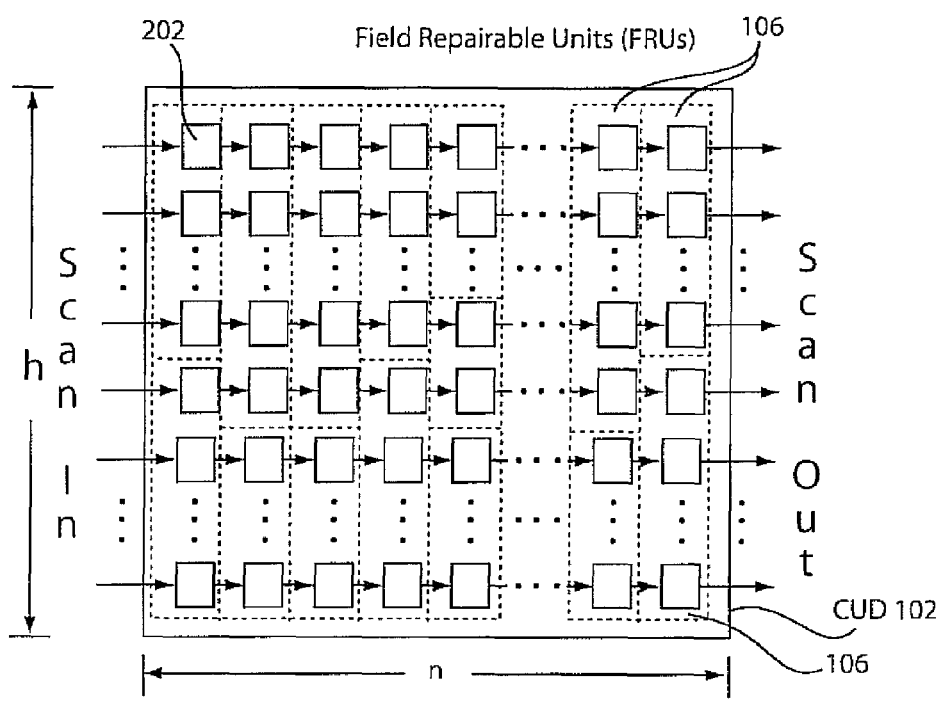
FIG. 2 is a high-level block/flow diagram of a circuit under diagnosis in accordance with exemplary implementations of the present principles illustrating one exemplary configuration of scan cells from different field repairable units grouped into tiles.

Referring to FIG. 2 with continuing reference to FIG. 1, the test patterns may be scanned into the CUD 102 to detect defects, as discussed herein below. In addition, the CUD response to the test pattern may be represented by an h-by-n matrix. The response of each scan cell 202 in the CUD 102 to the test pattern is presented by either a '1' or a '0' in the matrix. The actual CUD may include less than h*m scan cells; in this case the corresponding entry in the matrix may be padded, for example, by '0.' Furthermore, the matrix may be divided into h/m submatrices, $Y_0, Y_1, \ldots, Y_{h/m}$, as discussed herein below. Additionally, the matrix may be divided into n*h/m tiles 104, where each tile represents m scan cells. An FRU 106 is a block of cells 202 that can be repaired in the field if found defective. For example, an FRU may be a design block that can be replaced by a spare. A FRU 106 may include more than m scan cells 202, and thus can span across several tiles in the matrix. Additionally, FRUs 106 on a chip may have different functions and different sizes, including different numbers of scan cells 202.

Space and time compressors 112 may be configured to generate a single signature for a set of test patterns. For example, space compressors may compress an h-by-n response of the CUD to a test pattern into a length 2 l m-bit space-signature for some predetermined parameter l. For T test patterns, T space-signatures are generated. The time compressors may thereafter compress T space-signatures into a length 2 l m-bit signature for the set of test patterns T. The error location block or finder 114 may be configured to compare the signature generated by the Space and Time Compressors 112 to a predetermined signature of a defect-free circuit response. If the two signatures are different, a defect is detected. The difference between the signatures may be used to determine which tile contains the defective scan cell through an implementation of the Berlekamp-Massey algorithm, for example.

In accordance with exemplary aspects of the present principles, if a design block that is found to be defective, the defective block or FRU may be replaced with a spare that is prefabricated on the chip. In certain implementations, a spare may be prefabricated for every design block, for only selected critical design blocks if hardware overhead is a major concern, or for more than one design block if high reliability is desired. Additionally, Implementations of the present principles may apply off-line self-diagnosis techniques performed during a short downtime.

In contrast to prior art techniques which rely on complex software programs to compute possible defect locations, typically identifying many candidate locations for each defect, implementations of the present principles may compute the defect locations almost immediately after the response to the last test pattern is accumulated into a signature. In exemplary implementations, a special hardware for self-diagnosis that is based on Reed-Solomon codes may be employed. Further, all scan chains in the CUD may be analyzed at the same time, thereby resulting in a diagnosis time that is comparable to built-in self-test (BIST) time and that is shorter than other prior art methods.

In prior art methods, each scan chain is composed of scan cells in the same chip, while in exemplary implementations of the present principles, scan cells in a scan chain may belong to multiple FRUs. According to aspects of the present principles, scan cells need not be constructed in such a way that every scan chain is routed with scan cells in the same FRU, which is especially advantageous if FRUs are small. Here, defective FRUs having different sizes and sharing the same scan chains may be located. Furthermore, hardware overhead for a self-diagnosis circuit may be implemented with less than 1% of hardware overhead for large designs.

Referring again to FIG. 1, the CUD 102 may comprise a large number of design blocks (FRUs) and may be configured to employ a full scan. Each of the design blocks may be comprised of combinational gates and scan cells, also known as flip-flops. The sequence of test patterns generated by an on-chip test pattern generator 110 may be configured to achieve a very high fault coverage so that if an FRU is defective, there is at least one test pattern that causes scan cells in the FRU to capture errors.

According to exemplary aspects of the present principles, defective FRUs may be located by observing flip-flops in FRUs through scan chains. In various exemplary implementations of the present principles each scan chain can be routed with scan cells in more than one FRU and the numbers of scan cells in FRUs may vary. Here, as stated above, scan cells in the CUD may be represented by a h×n matrix Y, where h is the number of scan chains and n is the scan depth, i.e., the number of scan cells in the longest scan chain. Thus, each entry in the matrix represents a scan cell in the design.

The matrix description is illustrated in FIG. 1. During scan shift cycles, response values captured in all scan cells that belong to the same FRU are scanned out at the same cycle. In addition, scan values for these scan cells are scanned in also at the same cycle. That is, in the exemplary configuration of FIG. 1, scan cells in the same FRU occupy the same column in the matrix. Scan cells in the same FRU should be contiguous in that they are located in consecutive scan chains, as shown in FIG. 1. If an FRU has a defect, then the defect will cause errors at mostly multiple scan cells in the FRU. Thus, errors are likely to occur in clusters or bursts. By placing scan cells in the same FRU in contiguous scan chains, a burst-error correction strategy may be employed in which errors captured in multiple scan cells in the same FRU are treated like one error.

When a test pattern that can detect one or more defects in a defective FRU is applied, some scan cells in the defective FRU should capture errors caused by the defects. Those scan cells that capture errors are referred to herein as faulty scan cells. As discussed herein below, faulty scan cells may be located and in turn defective FRUs with faulty scan cell information are likewise located. Once identified, defective FRUs may be repaired, for example, by replacing them with defect-free spares.

To detect defective FRUs, the test pattern generator (TPG) 110 may generate T random test patterns, $p_0, p_1, \ldots p_{T-1}$. Similar to a typical scan-based built-in self-test (BIST) scheme, the response to each test pattern may be scanned out through h scan outputs and compressed by output compaction; responses of the entire T test patterns may be compressed into one signature. Faulty scan cells may be identified by the error-location finder 114 using the compressed signature, as discussed herein below.

According to exemplary aspects of the present principles, the CUD response to test pattern $p_1$ may be denoted by matrix $Y(p_1)$. Thus, $Y(p_1)$ is an h×n matrix where each of the h rows represents the response captured in a scan chain that has n scan cells. Thus, the response to each test pattern is scanned out through h scan outputs. Without loss of generality, it may be assumed that every scan chain has n scan cells. If a scan chain has fewer than n scan cells, then the values for the n-γ scan cells, where γ is the number of scan cells in the scan chain, may be filled by the test pattern generated by the TPG rather than the response. The matrix Y is partitioned into submatrices $Y_i$, where $i=0, \ldots, h/m-1$, for some m, where $2^m \geq T$. The division of matrix Y into submatrices $Y_1$ is illustrated in FIG. 1. Without loss of generality, it may be assumed that h/m is an integer from this point onwards. If h/m is not an integer, the last submatrix may be appended by appropriate number of all-zeros rows, for example. Each submatrix $Y_1(p_1)$ is in turn divided into n tiles of the same size. Hence, a CUD has a total of hn/m tiles. Since each tile has m elements (scan cells), each submatrix $Y_1(p_1)$ has dimension m×n. Note that since numbers of scan cells in FRUs vary, some tiles may include scan cells of two or more FRUs. For the sake of convenience and clarity of illustration, it is assumed herein below that the number of scan cells in any FRU is greater than m as described in FIG. 1. Thus, a tile may include scan cells from one FRU or two FRUs. However, it should be understood that the detection scheme disclosed herein is equally applicable to the case where some or all FRUs have more or less than m scan cells. Further it should also be understood that the detection scheme disclosed herein is also equally applicable to tiles that include more than two FRUs. Tiles that include faulty scan cell(s) are referred to as faulty tiles.

To analyze response $Y(p_1)$, the submatrices, $Y_1(p_1)$, may be rearranged horizontally in a contiguous fashion into a m×nh/m matrix through algebraic manipulation. This matrix may then be multiplied by the parity-check matrix of a length hn/m Reed-Solomon code in finite field or Galois Field $GF(2^m)$, with designed distance 2 l, where l is related to the largest expected number of tiles that include faulty scan cells in the response to any test pattern. This multiplication is referred to as space-compression, as it compresses nh bits of the chip response into 2 l symbols in $GF(2^m)$ (2l/m total bits), which are referred to as a space-signature. l is referred to herein as the maximal capacity of the compression scheme, as l is the maximum number of defective tiles that are detectable from a final compressed signature, s, discussed below.

As mentioned above separate space-signatures may be generated for each test pattern $p_1$, where $t=0, 1, \ldots, T-1$. The T space-signatures are then multiplied by the parity-check matrix of a length T Reed-Solomon code in $GF(2^m)$ with designed distance 2 l. This step is referred to as time-compression, as it compresses T space-signatures into 2 l symbols in $GF(2^m)$, which is the signature of the entire test response.

By comparing the compressed signature of the CUD for the entire test response to the good circuit (fault-free) signature, which may be previously computed for a fault-free circuit and stored in on-chip memory, for example, the presence and location of faulty tiles and corresponding defective FRUs may be detected. If the signatures do not match, for example, then the CUD includes faulty tiles. The difference between the two signatures is referred to as the syndrome. If faulty tiles exist, Reed-Solomon decoding techniques may be used to determine which tiles in each submatrix are faulty. If any faulty tile covers two FRUS, to determine which FRUs are faulty, the output of all the scan cells that belong to one FRU may be zeroed out, for example, to examine the specific output the other FRU that the defective tile covers. This is repeated for other faulty tiles that cover two FRUs and have different distributions. Zeroing out may be used for any expected CUD output to conceal responses to test patterns. It should be noted that although one of the FRUs covered by a defective tile is described as being zeroed out so that the other FRU covered by the defective tile may be examined, it should be understood that other means may be used to conceal the effects of one of the FRUs. For example, the effect of one of the FRUs may be concealed by assigning any known values other than all zeros to the scan output of the FRU.

The algebra used to conduct space and time compression in accordance with exemplary aspects is now derived. The space compression matrix $H=[\alpha^{(i)k}]$, $0 \leq i < nh/m$, $1 \leq k \leq 2l$, where $\alpha$ is a primitive element in the finite field $GF(2^m)$, and $l$ is some predetermined parameter relating to the maximum number of tiles in error, is defined as:

$$H = \begin{pmatrix} 1 & 1 & \cdots & 1 \\ \alpha & \alpha^2 & \cdots & \alpha^{2l} \\ \vdots & \vdots & \ddots & \vdots \\ \alpha^{nh/m-1} & \alpha^{2(nh/m-1)} & \cdots & \alpha^{2l(nh/m-1)} \end{pmatrix}.$$

The H matrix is partitioned into submatrices $H_j$, $j=0, \ldots, h/m-1$. Each submatrix $H_j$ has dimension $n \times 2l$.

$$H_j = \begin{pmatrix} \alpha^j & \alpha^{2j} & \cdots & \alpha^{2lj} \\ \alpha^{j+1} & \alpha^{2(j+1)} & \cdots & \alpha^{2l(j+1)} \\ \vdots & \vdots & \ddots & \vdots \\ \alpha^{j+n-1} & \alpha^{2(j+n-1)} & \cdots & \alpha^{2l(j+n-1)} \end{pmatrix}.$$

An example is provided herein below. Let H be the parity-check matrix of a length 6 Reed-Solomon code with $l=2$:

$$H = \begin{pmatrix} 1 & 1 & 1 & 1 \\ \alpha & \alpha^2 & \alpha^3 & \alpha^4 \\ \alpha^2 & \alpha^4 & \alpha^6 & \alpha^8 \\ \alpha^3 & \alpha^6 & \alpha^9 & \alpha^{12} \\ \alpha^4 & \alpha^8 & \alpha^{12} & \alpha^{16} \\ \alpha^5 & \alpha^{10} & \alpha^{15} & \alpha^{20} \end{pmatrix}.$$

Let $n=2$; H is divided into submatrices $H_j$, $j=0, 1, 2$:

$$H_0 = \begin{pmatrix} 1 & 1 & 1 & 1 \\ \alpha & \alpha^2 & \alpha^3 & \alpha^4 \end{pmatrix}$$

$$H_1 = \begin{pmatrix} \alpha^2 & \alpha^4 & \alpha^6 & \alpha^8 \\ \alpha^3 & \alpha^6 & \alpha^9 & \alpha^{12} \end{pmatrix}$$

$$H_2 = \begin{pmatrix} \alpha^4 & \alpha^8 & \alpha^{12} & \alpha^{16} \\ \alpha^5 & \alpha^{10} & \alpha^{15} & \alpha^{20} \end{pmatrix}$$

Space compression of $Y(p_t)$ is defined as $$Z(p_t) = \sum_{i=0}^{h/m-1} Y_i(p_t) H_i,$$

where the summation is over $GF(2^m)$. $Z(p_t)$ is a $1 \times 2l$ row vector and is referred to as the space-signature. The $Y_i(p_t)$ matrix can be viewed as a row vector with each column viewed as an element in $GF(2^m)$.

The time compression matrix G is defined as $$G = [\alpha^0, \alpha^1, \ldots, \alpha^{T-1}].$$

Let $Z = \lfloor Z(p_0)^{tr}, Z(p_1)^{tr}, \ldots, Z(p_{T-1})^{tr} \rfloor$. After space compression is complete, time compression on the space-signatures is performed:

$$s = GZ,$$

where $s = [s_0, \ldots, s_{2l-1}]$ is defined as the signature of the responses to the test patterns.

Let $s^0$ be the pre-computed signature for a defect-free CUD. The syndrome of the responses of the CUD to the applied test sequence is defined as $\delta^0 = [\delta_0^0, \ldots, \delta_{2l-1}^0] = s - s^0$, where subtraction is conducted in $GF(2^m)$. If the syndrome is the all zero vector, then it may be concluded that the CUD is defect-free.

Without the loss of generality, it is assumed here that the fault-free response of the CUD to every test pattern $p_t$, where $t=0, \ldots, T-1$, is all zeros. That is, $Y(p_t)=0$ for $t=0, \ldots, T-1$ and 0 represents the all-zero matrix, and thus $s^0$ is also the all-zero vector. The jth column of $Y_i(p_t)$, i.e., the portion of the response to test pattern $p_t$ for the kth tile, where $k=ni+j$, is denoted as $y_k(p_t)$. If the kth tile is defective, scan cells in the kth tile will capture errors in response to at least some test patterns. The error pattern generated from the response to test pattern $p_t$ is denoted as $e_k(p_t)$ where $k=ni+j$. From time compression $e_k$ may be obtained, where $$e_k = \sum_{t=0}^{T-1} e_k(p_t) \alpha^t.$$

Of course, multiple tiles may be faulty. Thus the αth component, $\delta_n$, of the syndrome $\delta$ is calculated as $$\delta_a = \sum_{k=0}^{nh/m} e_k \alpha^{(a+1)k}.$$

It should be noted that, here, the fault-free signature $s^0$ is the all zero vector. The syndrome for this particular pattern of faulty tiles is then $$\delta = [\delta_0, \delta_1, \ldots, \delta_{2l-1}].$$

To locate the faulty tiles, the following system of syndrome equations may be solved:

$$\delta_0 = e_{k_1} \alpha^{k_1} + e_{k_2} \alpha^{k_2} + \ldots + e_{k_g} \alpha^{k_g}$$

$$\delta_1 = e_{k_1} \alpha^{k_1} + e_{k_2} \alpha^{k_2} + \ldots + e_{k_g} \alpha^{k_g}$$

$$\delta_{2l-1} = e_{k_1} \alpha^{2lk_1} + e_{k_2} \alpha^{2lk_2} + \ldots + e_{k_g} \alpha^{2lk_g}$$

where g is the total number of faulty tiles. So we have $k_1, \ldots, k_g$ and $e_{k_1}, \ldots, e_{k_g}$ as unknowns for a total of 2g unknowns and 2l equations. The system of syndrome equations can be solved if $g \leq l$.

The system of syndrome equations may be solved using back-substitution or the Peterson algorithm, for example. However, low complexity techniques have been developed to solve the syndrome equations. In accordance with an exemplary implementation of the present invention, the Extended Euclidean algorithm may be used followed by a Chien search to determine $k_1, \ldots, k_g$, whose value can be used to locate the faulty tiles. In effect, $e_{k_1}, \ldots, e_{k_g}$ is of no interest here, as $e_{k_1}$ is the linear sum of all the errors that occurred during application of each test pattern, and cannot indicate which scan cell in the tile is in error.

Figure 8:
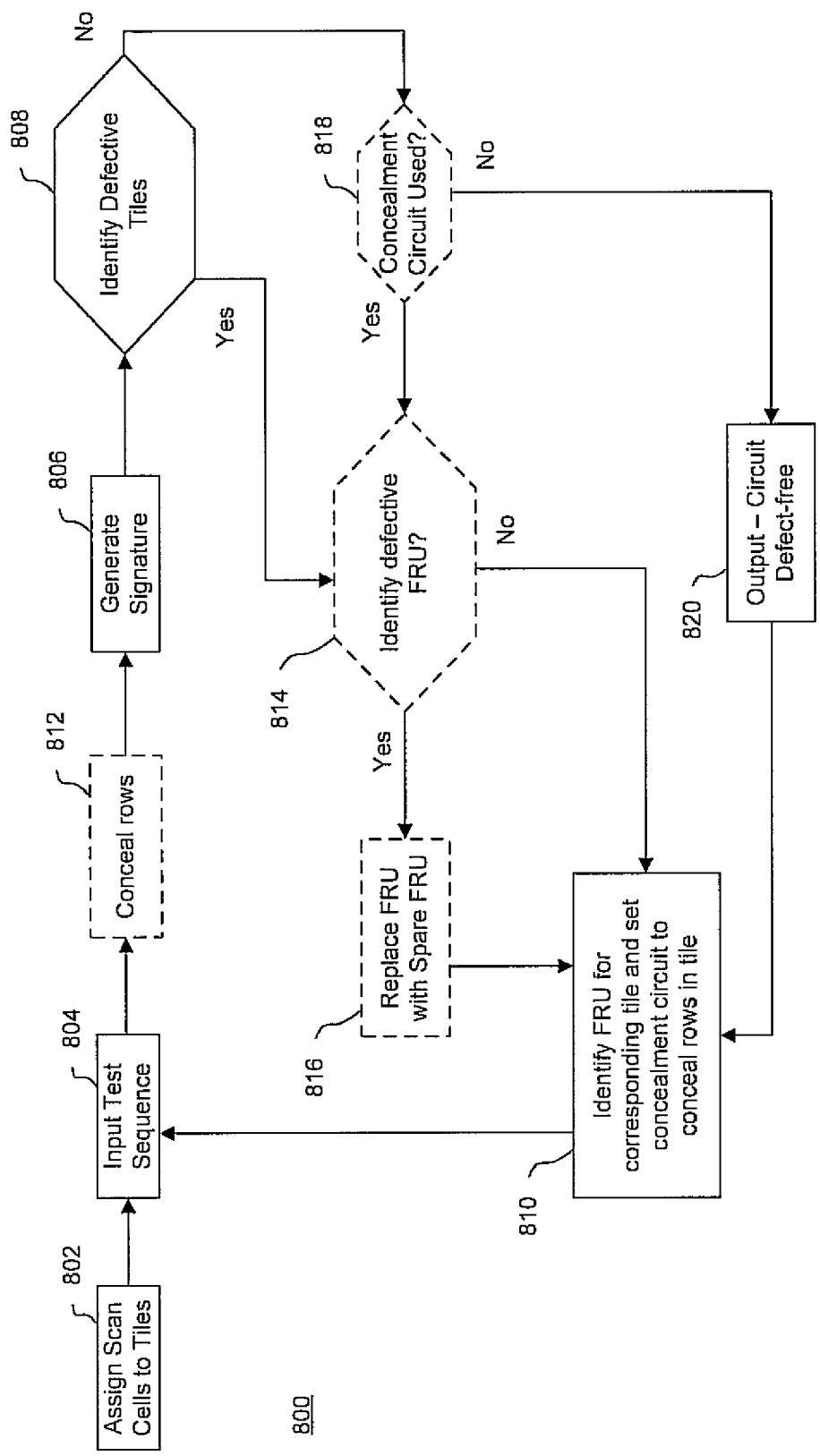
FIG. 8 is a high-level block/flow diagram of an exemplary method for identifying the location of defective field repairable units in a circuit in accordance with an exemplary implementation of the present principles.

With reference now to FIG. 8, a block/flow diagram illustrating an exemplary method 800 for identifying defective field repairable units of a circuit is shown. It should be understood that method 800 may be configured such that the solid blocks may be performed in the first and one or more subsequent passes of the diagram and the broken-lined blocks may be performed subsequent to the first pass of the diagram. For example, the first pass of the diagram may correspond to generating a space and time compressed signature for circuit responses to the set of T test patterns, as discussed above.

Method 800 may begin by assigning groups of scan cells of a circuit as described above with respect to system 100. For example, the circuit is comprised of field repairable units composed of different numbers of scan cells and the scan cells may be assigned such that at least one tile includes scan cells from a plurality of field repairable units.

At step 804, a test sequence, or set of test patterns T, for example, may be scanned through a circuit under diagnosis (CUD), as discussed above, for example, with respect to system 100.

At step 806, a compressed signature may be generated. For example, the space and time compressed signature may be generated, as discussed above. In addition, any one or more space and time compression circuits discussed herein with respect to FIGS. 4-7 may also be employed to generate the compressed signature.

At step 808, defective tiles are identified. For example, the defective tiles may be identified by comparing the generated signature, for example, s, with a pre-computed signature of a defect free circuit, for example $s^0$, as discussed above. Additionally, defective tiles may be located or identified by solving for a set of syndrome equations, as discussed above. If defective tiles are not identified, then the method may proceed to step 820, where it is determined that the circuit is defect-free. If defective tiles are identified, then the method may proceed to step 810.

At step 810, FRUs that belong to one or more of the defective tiles are identified. For at least one of the tiles identified as having a defect, a controller, such as, for example, error location finder 114, may be configured to conceal the output of all FRUs within a tile except for an FRU that is examined in the next pass of the diagram, as discussed herein below. Thus, concealed rows of scan cells, corresponding to one or more FRUs, within a tile may be concealed while scan cells corresponding to an FRU different from the one or more FRUs are not concealed for analysis in a next pass. Thus, for tiles that include scan cells of two FRUs, or possibly more FRUs if the number of scan cells in FRUs is less than m in other implementations, which corresponding FRU(s) are defective may be determined by running another pass through the diagram in FIG. 8. It should be understood that rows of different tiles may be simultaneously concealed. In addition, the concealment circuit 108 may be controlled by the controller to effect concealment of rows.

A faulty tile that includes scan cells of two or more FRUS may be selected and another test session may be run with the same test sequence. Thus, step 804 may be repeated to examine one FRU in each of one or more of the identified defective tiles.

At step 812, the responses of all scan cells belonging to one or more of the FRUs in a defective tile may be concealed during a new test session. For example, as discussed in more detail below, responses belonging to FRUs other than the FRU under analysis during the current pass may be zeroed out using a zero-out block. In this way, for example, a circuit response to a scan of the set of test patterns may be set to a pre-determined value to remove the first circuit response from consideration with respect to an application of a set of test patterns.

Thereafter, step 806 may be repeated so that a new signature is generated with responses that include concealed rows. Further, step 808 may be repeated to determine whether the response from a defective tile in question include an error, as discussed above. For example, a defective FRU may be identified by comparing the generated signature, for example, s, with a pre-computed signature of a defect free circuit, for example $s^0$, as discussed above. For example, if s matches $s^0$, then the FRU in question may be deemed defect-free; otherwise, the FRU in question includes a defect.

If the tile does not indicate an error, then step 818 is performed to determine whether a row concealment has been employed. If a row concealment has not been employed for the one or more tiles in question, then it is determined at step 120 that the tile in question is defect-free. Thereafter, step 810 may be repeated to examine another tile in question that exhibited a defect in the first pass of the diagram. If a row concealment was employed, then step 814 may be performed to determine whether the currently analyzed FRU is defective. Here, because the response to the test sequence or set of test patterns by the tile indicated that there was no defect, then the FRU under current analysis within the tile is determined at step 814 to be defect-free. In addition, it should be noted that if the scan cells in the tile in question corresponded to only two FRUs, then it may be determined at step 814 that the other FRU, whose rows of scan cells had been concealed, is defective. Thereafter, the defective FRU may be replaced by a spare at step 816. Otherwise, another FRU contributing cells to the tile under analysis in the current pass may be selected at step 810 and examined with another test session applied again in step 804. Thereafter, all rows in the tile in question except for the newly selected FRU in the tile in question may be concealed. If the FRU examined in the current pass is the last FRU for the tile in question, then another defective tile, if any, may be selected and the process may be repeated to detect the location of defective FRUs for the next defective tile. The process may continue until all defective FRUs are identified.

Returning to step 808, if it is determined that the tile in question includes an error, then, in response, at step 814, it is determined that the FRU examined in the current pass is defective. The defective FRU may be repaired at step 816. For example, the defective FRU may be replaced by a spare FRU. As discussed above, FRU spares may be located on-chip and used in lieu of defective FRUs. It should be understood that the FRU may be repaired by other means in step 816, as understood by those of ordinary skill in the art. To determine whether other FRUs that contribute to scan cells in the tile in question, another FRU may be selected for analysis in step 810 and the process may be repeated for the next FRU. During the repeated process, at step 812, all rows in the tile in question except for the newly selected FRU in the tile in question may be concealed. If the FRU examined in the current pass is the last FRU for the tile in question, then another defective tile, if any, may be selected and the process may be repeated to detect the location of defective FRUs for the next defective tile. The process may continue until all defective FRUs are identified.

The signature of the responses of a defect-free CUD when the first b rows are zeroed out in $Y_j$, $\forall j$ is denoted as $s^b$, where b=0, . . . , m−1. For example, $s^{0}$ denotes the signature of a defect-free CUD when no rows are zeroed out, $s^5$ denotes the signature of a defect-free CUD when the first 5 rows are zeroed out, and finally $s_{m-1}$ denotes the signature a defect-free CUD when all the rows are zeroed out except the last row.

Likewise, $\delta^b$ is defined as the syndrome of the CUD response when the first b rows are zeroed out in $Y_j$, $\forall j$.

As another example, it is assumed that the first b scan cells of tile $y_k$ belong to FRU A and the rest of the m-b scan cells belong to FRU B and that it is determined from syndrome $\delta^o$ that errors exist in tile $y_k$. Accordingly, another test session is run with the first b rows zeroed out, effectively taking FRU A out of consideration. If $\delta^b$ equals 0, then the faulty scan cells must belong to FRU A. If $\delta^b$ does not equal 0, then there must exist faulty scan cells in FRU B. It is assumed here that $\delta^b$ does not equal 0, thus FRU B is found to be defective and replaced by a spare. The test session is rerun with no zeroed-out rows to ensure that FRU A is not defective. During this third run, if syndrome $\delta^o$ does not equal 0, then FRU A should be replaced as well. If $\delta^o$ equals 0, the repair process completed.

With regard to the storage space used for compressed signatures, let b be the number of scan cells that belong to the first FRU of a tile that includes scan cells of two FRUs. As described above, a separate signature is used for every distinct b that exists in the CUD and hence the total number of signatures to be stored is determined by the number of distinct b's. Because, here, the size of each MISR is m bits, the total number of storage bits for the fault-free signatures is given by 2 lmB bits, where B is the number of distinct b's in the CUD. In the worst case scenario, i.e., for every possible b, where b=0, 1, . . . , m−1, there exists at least one tile whose first b scan cells belong to one FRU and the other m-b scan cells belong to the other FRU, the total number of storage bits for the signatures is $2 lm^2$ bits.

With reference to FIG. 1 with continuing reference to FIG. 8, it should be understood with respect to method 800 that in exemplary implementations, the test pattern generator 110 may be configured to perform step 802, the zero-out circuits 108 may be configured to perform step 812, the space and time compressors 112 may be configured to perform step 806, and the error location finder block 114 may be configured to perform steps 808, 810, 814, 816, 818, and/or 820. Further, a controller (not shown) may be configured to perform one or more of steps 808, 810, 814, 816, 818, and/or 820.

It should be understood that the process discussed above may be conducted without concealing all rows in a defective tile except for one to iteratively examine each FRU contributing scan cells to the tile one at a time to determine defective FRUs. For example, for a tile known to include a defect that includes scan cells from two or more FRUs, applying the test patterns while concealing rows from only a single FRU will indicate that the concealed FRU is defective if responses from all other rows in the tile indicate that there is no defect. The tile may be known to have a defect from a previous run of test patterns, as discussed above. As another example, if defective FRUs in a tile have been replaced recently or during the process, it may be assumed that their responses to test circuit are correct (i.e., do not indicate a defect). Thus, the responses from rows of repaired FRUs need not be concealed during a test pattern scan. Accordingly, at step 810, discussed above, the rows corresponding to repaired FRUs need not be concealed with rows from un-repaired FRUS that are concealed to examine rows from a different un-repaired FRU. Further, both repaired FRUs and FRUs determined to be defect free need not be concealed when running a test pattern. However, these modifications are only exemplary of those that may be made by one of ordinary skill in the art in light of the teachings disclosed herein.

Figure 3:
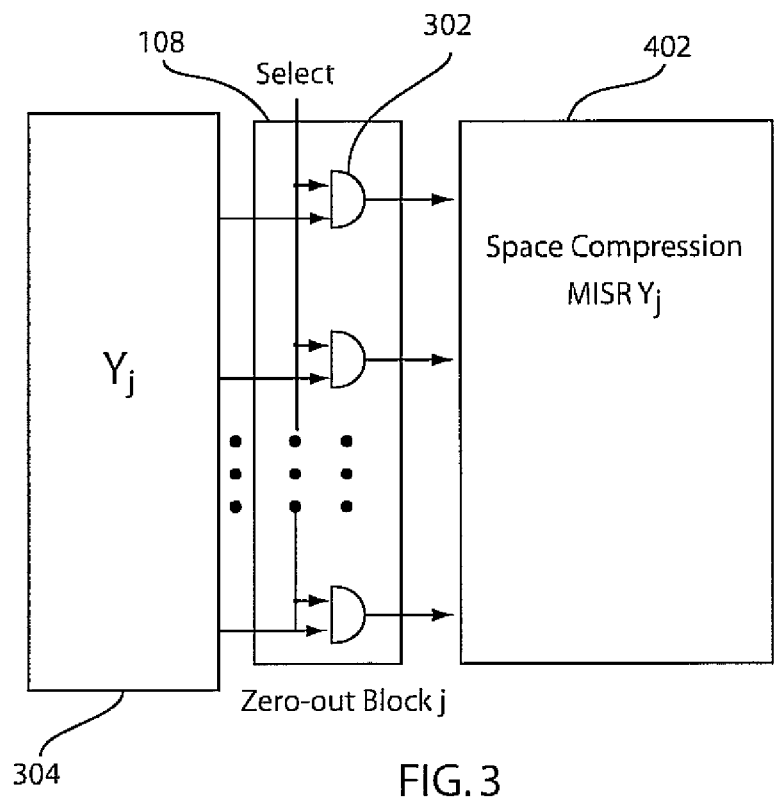
FIG. 3 is a high-level diagram of an exemplary concealment circuit that may be used to identify the location of defective field repairable units in a circuit under diagnosis.
Figure 4:
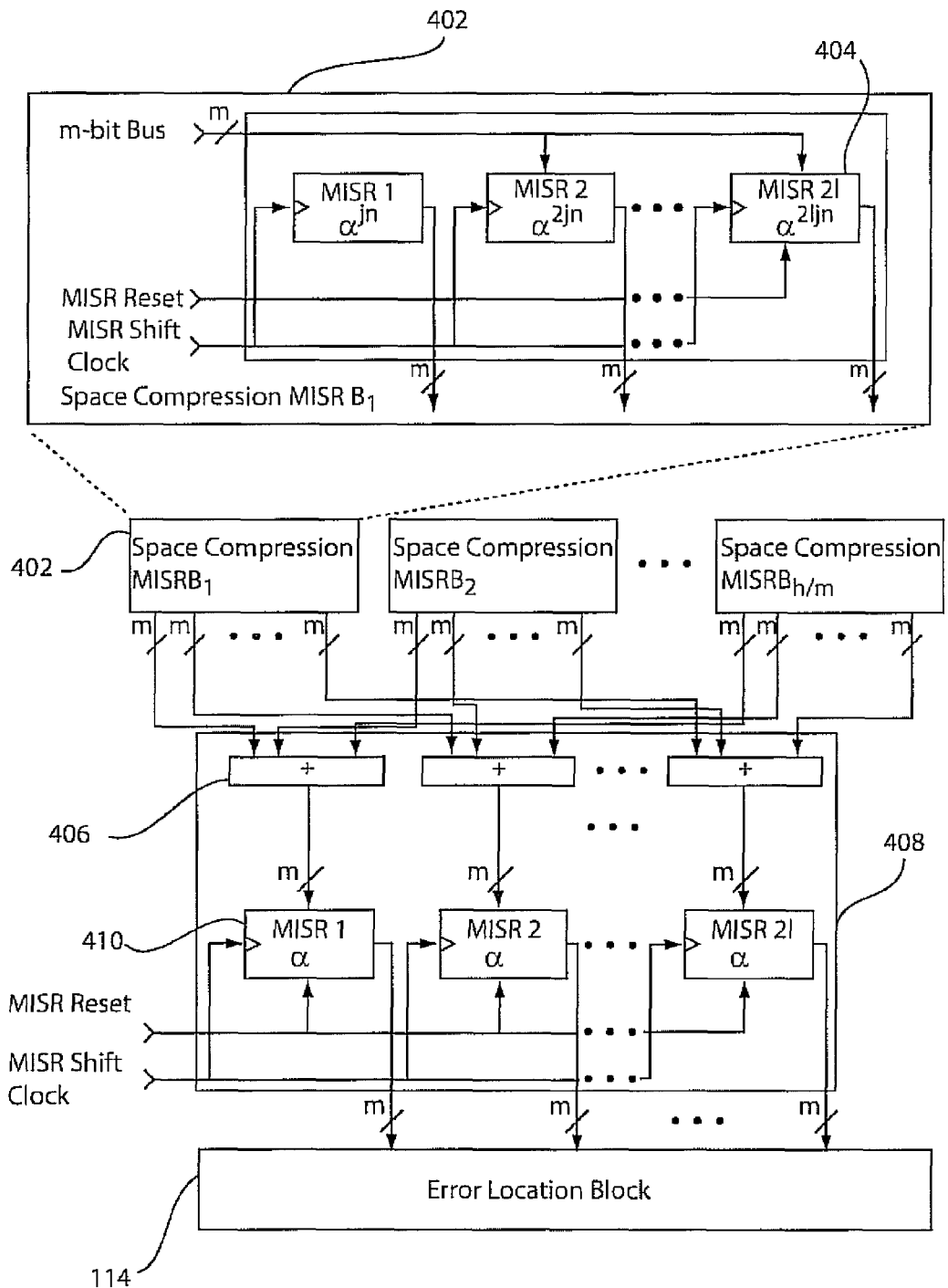
FIG. 4 is a high-level block/flow diagram illustrating compressor blocks in accordance with an exemplary implementation of the present principles.

Referring now to FIGS. 3 and 4 with continuing reference FIG. 1, an exemplary implementation that employs Multiple Input Signature Registers (MISRs) to perform space and time compression in accordance with aspects of the present principles is illustrated. As shown in FIG. 1, a response of the CUD, Y, is divided into h/m sub-responses, $Y_1, Y_2, \ldots, Y_{h/m}$. Each sub-response $Y_j$ 304 is fed into a zero-out circuit $O_j$ 108, for example, which is used to zero-out certain rows to determine which scan cells in a faulty FRU include errors, as discussed above. The zero out circuit 108 is one example of a concealment circuit. The h/m m-bit outputs corresponding to $Y_1, Y_2, \ldots, Y_{h/m}$ from each zero-out block are fed into their corresponding space-compression MISR blocks 402, $MISRB_1$-$MISRB_{h/m}$. For example, for each scan shift in the CUD, the m-bits corresponding to $Y_1$ is fed to $MISRB_1$, the m-bits corresponding to $Y_2$ is fed to $MISRB_2$, etc. The outputs from the space-compression MISR block 402 are in turn fed into the time-compression circuit 408 to generate the signature. The zero-out blocks can be implemented with AND gates 302 as shown in FIG. 3. The control signals used to zero out or propagate certain outputs of scan chains can be generated by an in-stage register or a decoder. Finally, the signature is input into the error-location finder block 114, which determines which tiles and eventually which FRUs in the CUD include errors by comparing the generated signature to a signature of a defect-free circuit, as discussed above.

Each space-compression MISR block $MISRB_j$ 402, where j=1, 2, . . . , h/m, includes 2 l m-stage MISRs 404 that perform arithmetic calculations in $GF(2^m)$. In every scan shift cycle, each individual MISR, $MISR_i$ 404, in space-compression MISR block $MISRB_j$ 402 adds new data, e.g., outputs of zero-out block $O_j$, to values stored in its flip-flops and multiplies the sum by $\alpha^{ijn}$, where $1 \leq i \leq 2$ l. After the entire response to a test pattern has been scanned out, i.e., after n consecutive scan shift cycles, the output of this space-compression MISR block is added with the output of the other space-compression MISR blocks in adders 406. Each output of adders 406 corresponds to an entry in a space compression signature $Z(p_t)$ for a test pattern, discussed above. The resultant space-signature is fed into the time-compression block 408, as illustrated in FIG. 4.

The time-compression circuit 408 may be configured to add new data from the space-compression circuit to the value stored in its 2 l MISRs 410 and multiply the result by $\alpha$, as illustrated in FIG. 4. New data is added to MISRs 410 after a test pattern is scanned out. After the entire test-session is complete, i.e., after T test patterns have been applied and responses to them have also been accumulated to generate the final signature, s, described above, the time-compression MISRs will have the signature stored in its registers and the signature is thereafter input into the error-location finder block 114, which generates the syndrome by comparing the signature with a predetermined fault-free signature. Each MISR 410 output corresponds to an entry in the finalized length 2 l time compressed signature s, which is representative of the CUD response to a set T of test patterns. The error location finder block 114 determines which FRU in the chip includes faulty scan cells from the comparison, as discussed above. This can be accomplished through implementation of the extended Euclidean algorithm or the Berlekamp-Massey followed by the Chien search algorithm, for example, as stated above.

For the Space Compression circuit illustrated in FIG. 4, the storage space used to implement the circuit is relatively large. For example, if l=5 and m=20, then 10,000 flip-flops are used to implement the space-compression circuit. The number of MISRs, and, in turn, the number of flip-flops, used may be reduced by exploiting the fact that the frequency of the scan shift clock is normally much lower than that of the system clock. Thus, the space-compression MISRs can run at much faster speed than the frequency of the scan shift clock.

Figure 5:
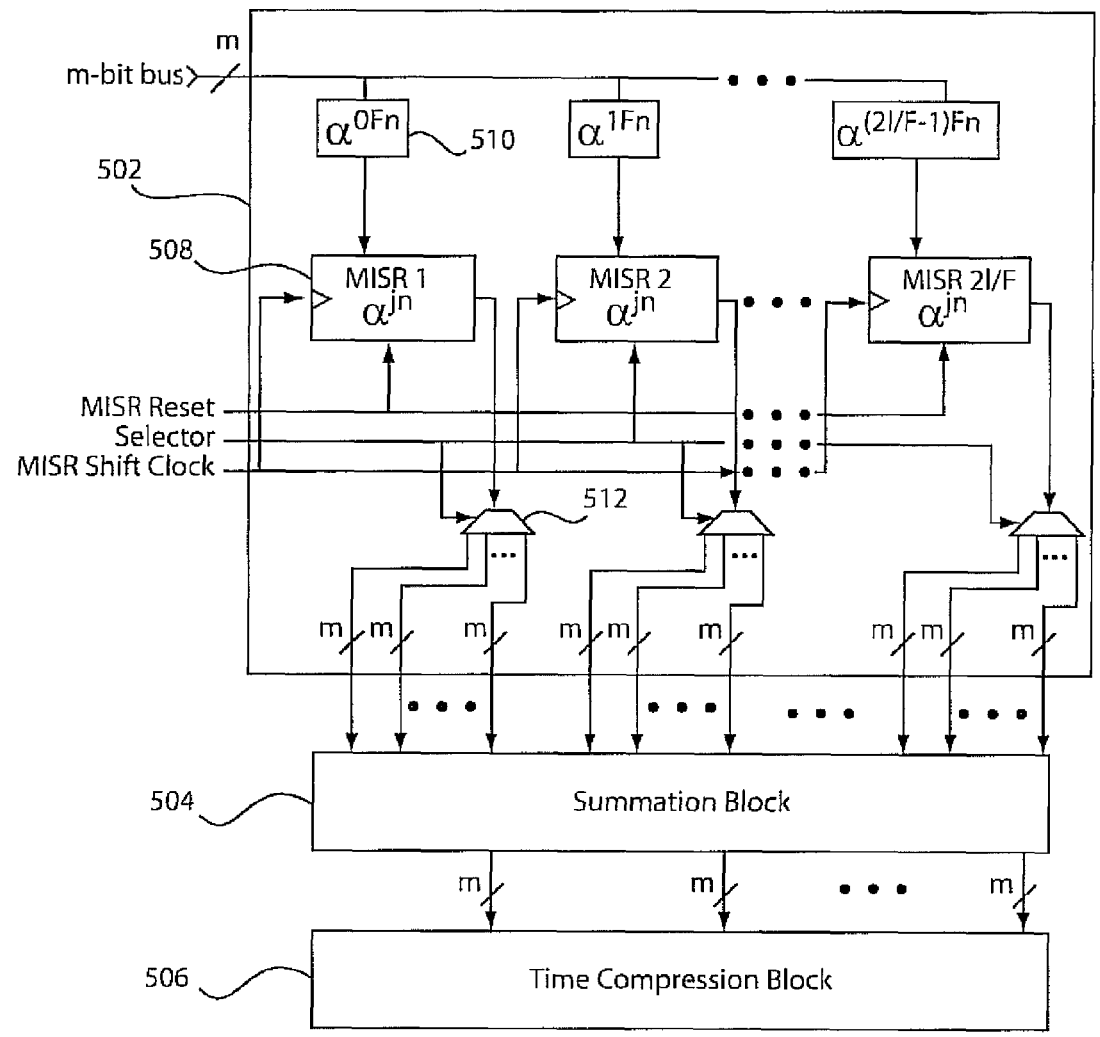
FIG. 5 is a high-level block/flow diagram illustrating a space compression block in accordance with an exemplary implementation of the present principles.
Figure 6:
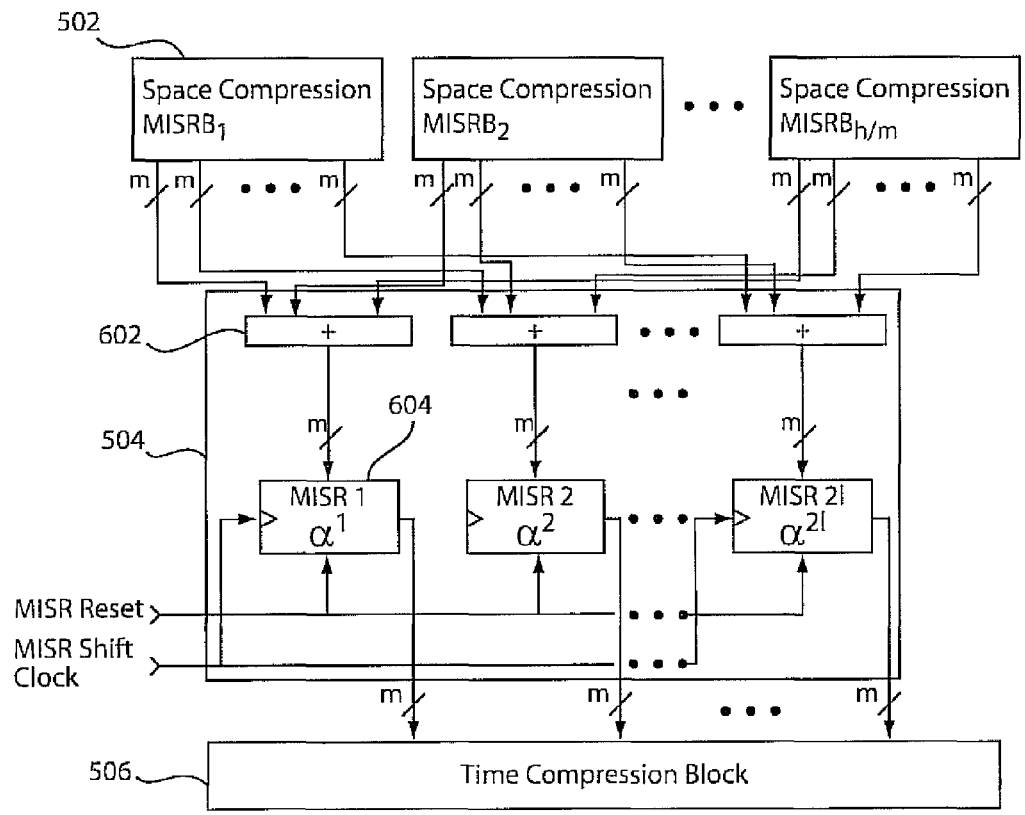
FIG. 6 is a high-level block/flow diagram of a summation block used for space compression of circuit responses to a test pattern in accordance with an exemplary implementation of the present principles.
Figure 7:
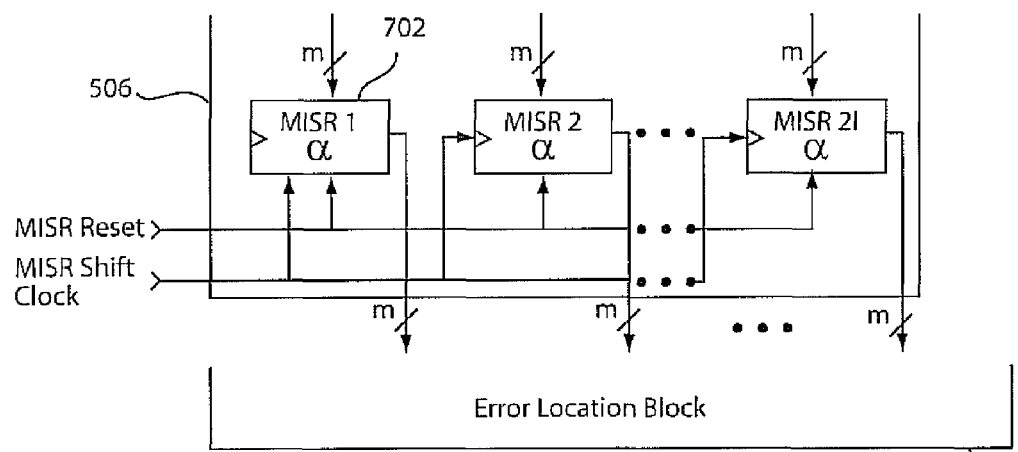
FIG. 7 is a high-level block/flow diagram of a time compression block in accordance with an exemplary implementation of the present principles.

With reference now to FIGS. 5-7, high-level block flow diagrams of an exemplary embodiment of the present principles illustrating a space compression block 502 and a summation block 504 that exploit the faster speed of system or register clocks are provided. The clock speed of space-compression MISRs may be represented as being F times faster than the speed of the scan shift clock. Because new data is available at scan chain CUD outputs every F register clock cycles, the same MISR, $MISR_i$, may be used in each space-compression MISR block $MISRB_j$ to calculate the multiplication of input data $Y_j$ by $\alpha^{ijn}, \ldots, \alpha^{(l+F)jn}$, for F register clock cycles in sequence as opposed to performing the calculation in parallel using F MISRs, as described above with respect to FIG. 4.

Every F register clock cycles, h/m m-bit outputs corresponding to $Y_1, Y_2, \ldots, Y_{h/m}$ from each zero-out block are fed into their corresponding space-compression $MISRB_j$ blocks 502, $MISRB_1$-$MISRB_{h/m}$, shown in FIG. 6. FIG. 5 illustrates the processing of m-bit vectors fed into one of the MISR blocks 502. As noted above, a new m-bit vector is fed into a MISR block 502 ever F register clock cycles. Upon entering a MISR block, the m-bit vector is multiplied in parallel by constants in $GF(2^m)$, $\alpha^0, \alpha^{Fn}, \ldots, \alpha^{(2l/F-1)Fn}$, wherein $\alpha$ is a primitive element in $GF(2^m)$, in multipliers 510. The resulting values are passed from multipliers 510 onto their corresponding MISRs 508, e.g., MISR 1-MISR 2 l/F, respectively. Then, at each register clock cycle, each MISR block multiples the sum of its current content and its input by an indicated value in $GF(2^m)$, in this case, $\alpha^{jn}$. The inputs correspond to the value outputs from the multipliers 510 and are input into their corresponding MISRs every register clock cycle. The result of the additions and multiplications in the MISR 508 is fed into the summation block 504 every register cycle. Thus, each MISR in the space-compression block clocks every scan shift cycle to generate F different values. Selectors 512 are configured to route the resulting values from each pass in the MISRs 508 to the appropriate adder 602 in the Summation block 504 of FIG. 6 in response to signals received from the error location finder block, for example. When a new vector is shifted out from the scan out of the CUD, the MISRs 508 clear their current value.

As shown in FIG. 6, the h/m adders 602 of the summation block 504 XOR corresponding outputs from the h/m space compression MISRs 502. The result is fed into the 2 l MISRs 604 of the summation block 504, which are denoted as MISR $Y^D$, every scan shift cycle, or every F register cycles. Each of the MISRs 604 multiply the sum of its input and current content by their corresponding value in $GF(2^m)$, i.e., one of $\alpha^0$-$\alpha^{2l}$, respectfully, to generate a space-compression signature. After nF register cycles, or, equivalently, for every test pattern, the content of the MISRs 604 is output as the space-compression signature for the corresponding test pattern. The MISRs 604 in the summation block are cleared every nF register clock cycles, that is, whenever a new test pattern is input into the CUD. The MISRs are clocked every F register clock cycles; that is, they are clocked whenever a new vector is available from the scan out.

After the response from the entire test-pattern is calculated, the space signature is fed into the time-compression circuit 506. Here, similar to time-compression circuit 408, discussed above, the time-compression circuit 506 may be configured to add new data from the summation block 504 to the value stored in its MISRs 702 and multiply the result by $\alpha$, as illustrated in FIG. 7. The time-compression is clocked whenever a new input is available, which is every nF cycles, where n is the scan depth. The process continues until the entire set of T test patterns have been applied and responses to them have also been accumulated to generate the final signature. The time-compression MISRs will have the signature stored in its registers and the signature is thereafter input into the error-location finder block 114, which generates the syndrome by comparing the signature with a predetermined fault-free signature, as discussed above.

The exemplary serial implementation of the space-compression circuit described in FIGS. 5-6 employs [2 l/F][h/m] m-stage MTSRs 508 in addition to 2 l m-stage MISRs 604 for the summation block 504. Thus, using a serial implementation can save total of (2 l–[2 l/F])[h/m]m-stage MISRs. The time compression 506 utilizes 2 l m-stage MISRs 702.

Although very unlikely for very large CUDs, the diagnosis circuit itself may include defects that render any analysis of the CUD unrealiable. Thus, in accordance with various exemplary implementations of the present principles, multiple diagnosis circuits may be provided on a chip to improve reliability. If three or more diagnosis circuits are employed, for example, then majority voting may be used to identify the faulty diagnosis circuit(s). If a diagnosis circuit includes a defect, the output of the defective diagnosis circuit may be ignored or may be repaired in the same manner in which a defective FRU is repaired, as discussed above.

If only two diagnosis circuits are implemented, one diagnosis circuit may be active and the other may be used as a spare. To identify whether a diagnosis circuit is faulty, if Reed-Solomon codes are employed, for example, the linearity property of Reed-Solomon codes may be used. Because Reed-Solomon codes are linear, the correct signature for a length h all-zero vector is a length 2 l all-zero vector. Furthermore, in exemplary implementations, the length h input vector is divided into [h/m] symbols, with each symbol representing a tile on the CUD, in the finite field $GF(2^m)$. In addition, the Reed-Solomon code can correct l symbols in error.

Thus, to test whether a diagnosis circuit is faulty, n length-[h/m] test vectors in $GF(2^m)$ may be generated with the total number of non-zero symbols in the n vectors less than l. The test vectors may be fed into a space compression block discussed above. A fault-free diagnosis circuit will be able to identify both the location and the value of the non-zero symbols in the vectors. If the diagnosis circuit cannot correctly identify the non-zero symbols in one of the test vectors, then the diagnosis circuit is faulty. To ensure that the diagnosis is fault-free, however, all possible vectors where the total number of non-zero symbols is smaller than l should be generated. For large CUDS, this approach may be impractical since the number of such vectors is large. Therefore, for such CUDs, the exhaustive test sequence should be replaced with a random pattern sequence.

It should be understood that exemplary aspects of the present principles permit at least one additional benefit in that defective tiles are discoverable at any tile location in the CUD and in any quantity within the maximal capacity from the compressed signature in one pass of the test patterns. For example, referring again to FIG. 8, at step 804, as stated above, a set of different test patterns may initially be scanned through the CUD to detect defective tiles. Further, the set of test patterns may be scanned through the CUD in a set of parallel scan chains to detect all defective tiles in one pass of the test pattern set scan. To identify at most l faulty tiles in one pass, the signature is 2 ml bits, where m is the number of bits or size of a scan chain and l is the maximal capacity.

According to prior art methods, as stated above, each pass of test patterns is scanned through a CUD one scan chain at a time, in sequence. The location of at most l faulty tiles may be determined from a signature of 2 ml bits in one pass of a test pattern scan. If the number of faulty tiles is larger than 1, the process fails.

The prior art methods may be extended such that scan chains are scanned through a CUD in parallel. For example, assume that h, e.g., 10, scan chains are scanned out at the same time. While prior art methods may be extended to include simple parallelization of scan chains, the resulting error location capability of the signature is divided or distributed among the h, e.g., 10, scan chains. For example, if l=100 and 10 parallel scan chains are employed, i.e. h=10, then the error location capability is divided among the parallel chains. For example, the error location capability is divided equally among the parallel chains such that each scan chain can only contain at most 10 faulty units. If the first chain contains 11 faulty units, and the other 9 chains contain 0 faulty units, the error location process will fail, even though the total number of faulty units is 11, which is below the maximal capacity.

In contrast, in accordance with exemplary aspects of the present principles discussed above with regard to compression, the output of the parallel scan chains may be compressed into signatures in such a way that defective tiles are discoverable at any tile location in the CUD and in any quantity within the maximal capacity from a compressed signature in one pass of the test patterns. In other words, if all errors are less than or equal to 1, the errors can found in one pass from a compressed signature, regardless of how they are arranged among the different parallel chains. For example, if the first scan chain contains 11 faulty tiles, and the other 9 chains contain 0 faulty tiles, 11 faulty tiles may be correctly identified in accordance with the compression methods of the present principles discussed above. The capability of identifying any defective tile within the maximal capacity in any location of the CUD cannot be achieved with prior art methods using a compressed signature of the same size. In accordance with prior art methods, a signature that is a size of h times 2 ml is required to have the same unit coverage. Thus, aspects of the present principles provide a significant advantage in that a relatively small amount of memory may be used to identify defective tiles in one pass of a set of test patterns.

Figure 9:
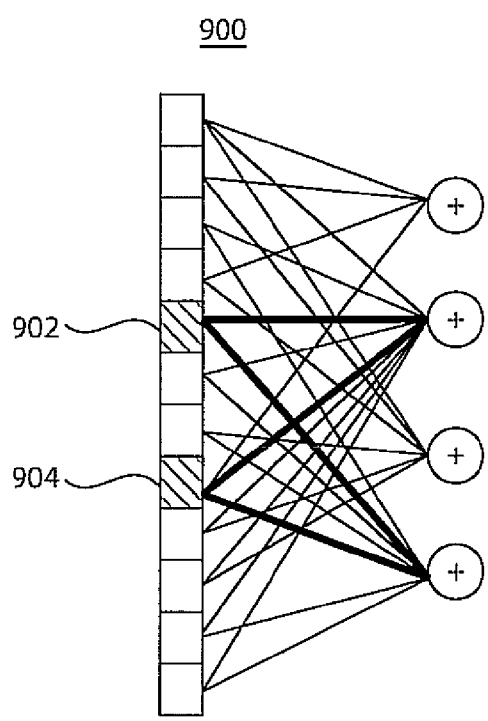
FIG. 9 is a high level graph 900 illustrating the use of low-density parity-check codes (LDPC) in column compression.

With reference now to FIG. 9, a high level graph 900 illustrating the use of low-density parity-check codes (LDPC) in column compression is shown. LDPC may be employed to conduct column compression in various exemplary implementations of the present principles to reduce space compression complexity. In LDPC codes, bits are used to form various parity checks. Likewise, several rows in a column may be XORed together before inputting the data from the rows into the concealment circuit block, for example, the zero-out block, as illustrated in FIG. 9. This would further reduce the number of MISRs used for space-compression. However, errors may, at times, be canceled out when XORed together. This occurs when the scan cells with errors, e.g., 902 and 904, form a cycle in the underlining graph as illustrated in FIG. 9, where the bold lines form a cycle. The probability of error canceling may be reduced by constructing graphs with large minimum-length cycles, or large girth. If the number of scan cells with errors is smaller than the girth of the graph, then the errors are guaranteed to not all cancel out, and thus the faulty tile can be identified by comparing the signatures. If it is known, for example, that the maximum number of faulty scan cells in a tile is expected to be smaller than 5, then a graph with girth 10 or more may be constructed. In this way, the errors will never all cancel out. Techniques to construct graphs with large girth are known by those of ordinary skill with respect to graph theory.

Column compression may be conducted in several ways. As stated above, the matrix representing the CUD, Y, may be divided into partitions $Y_i$. In one compression method, each partition may be compressed independently by an LDPC code. Each partition may use the same LDPC code. This is the most straightforward method of column compression using LDPC codes. However, because the length of each LDPC code is short, the girth of the underlining graph will be small, and thus the probability of errors canceling each other is high. Another method includes permitting LDPC codes in neighboring partitions to share some nodes, which allows for larger graphs and thus larger girth leading to lower probability of errors canceling each other. This also could possibly reduce the resolution used by merging some of the overlaps into one. A different method includes using one LDPC code to compress the entire column. Although this method may increase resolution applied, it generates the largest graph and thus the largest girth, resulting in lowest probability of errors canceling each other.

Implementations of the present principles as discussed herein permit the diagnosis of circuits comprised of field repairable units having different sizes. In addition, by applying exemplary implementations of the present principles, hardware complexity may be reduced. As stated above, when the size of constituent multiple-input signature-register (MISR) is m, the total number of signatures to be stored for the fault-free signature is 2 lmB bits, where $1 \leq B \leq m$. It can be shown that diagnosis systems described above can locate multiple FRUs in the same test session and can be implemented with relatively little hardware overhead. Thus, in accordance with the present principles, hardware overhead for a diagnosis circuit may be efficiently reduced for large CUDs.

Embodiments described herein may be entirely hardware or including both hardware and software elements. In a preferred embodiment, the present principles are implemented in hardware and software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores and/or communicates the program for use by or in connection with the instruction execution system, apparatus, or device. The medium can be magnetic, optical, electronic, electromagnetic, infrared, or semiconductor system (or apparatus or device). The medium may include a computer-readable medium such as a semiconductor or solid state memory, magnetic tape, a removable computer diskette, a random access memory (RAM), a read-only memory (ROM), a rigid magnetic disk and an optical disk, etc.

Having described preferred embodiments of systems and methods for locating defective portions of a circuit (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A system for identifying the location of defective field reparable units comprised of scan cells in a circuit under diagnosis (CUD) comprising:
- a test pattern generator configured to generate a set of test patterns for scanning through scan cells of the CUD which are arranged in tiles such that at least one tile includes scan cells from a plurality of field repairable units, wherein the CUD is comprised of field repairable units composed of different numbers of scan cells;
- a compressor block configured to generate compressed signatures of CUD responses to the set of test patterns, the compressor block including separate signature register blocks, each signature register block configured to receive CUD responses to the set of test patterns from tiles in a row of the CUD that is different from rows of tiles received and processed by other signature register blocks;
- a concealment circuit configured to conceal CUD responses from a set of rows of scan cells in a first tile by setting a response to the set of test patterns from the first set of rows of scan cells to a pre-determined value, wherein the first set of rows of scan cells include all scan cells contributed to the first tile by at least one field repairable unit; and
- error location finder block configured to analyze the compressed signatures and to determine that a second field repairable unit different from the at least one field repairable unit is defective if a response to the set of test patterns from rows of non-concealed scan cells in the first tile indicates a defect;
- wherein the at least one field repairable unit is a single first field repairable unit and wherein the error location finder block is further configured to determine that the first field repairable unit is defective if the response from the rows of non-concealed scan cells indicates that there is no defect in the response from the rows of non-concealed scan cells.

2. The system of claim 1, wherein the signature register blocks are configured to multiply CUD test pattern responses by components of a space compression matrix to generate space compressed signatures for each test pattern, wherein the components include a first set of primitive elements of a Galois Field, the primitive elements having different powers.

3. The system of claim 2, wherein the compressor block further includes a time compressor block that is configured to multiply each space compressed signature by a corresponding component in a second set of primitive elements of a Galois Field to generate a final compressed signature for the set of test patterns.

4. The system of claim 3, wherein the error location finder block is further configured to compare the final compressed signature to a compressed signature of a defect-free circuit, generate a system of syndrome equations including variables corresponding to the position of tiles in the CUD, and solve the system of syndrome equations for the variables to identify tiles that include faulty scan cells.

5. The system of claim 1, wherein the CUD is configured to scan the set of test patterns through scan cells at a scan shift rate and wherein each signature register block includes at least one signature register that is configured to multiply a circuit response of a tile of a corresponding row of tiles with a plurality of different elements of a compression matrix in sequence during a cycle of the scan shift rate.

* * * * *